United States Patent [19]

Iranmanesh

[11] Patent Number: 5,682,058

[45] Date of Patent: Oct. 28, 1997

[54] MULTILAYER ANTIFUSE WITH LOW LEAKAGE AND METHOD OF MANUFACTURE THEREFOR

[75] Inventor: Ali A. Iranmanesh, Sunnyvale, Calif.

[73] Assignee: Crosspoint Solutions, Inc., Santa Clara, Calif.

[21] Appl. No.: 221,332

[22] Filed: Mar. 31, 1994

[51] Int. Cl.$^6$ .................... H01L 29/04; H01L 29/00
[52] U.S. Cl. ................. 257/530; 257/50; 437/922
[58] Field of Search .............. 257/50, 530; 437/922

[56] References Cited

U.S. PATENT DOCUMENTS

| | | | |
|---|---|---|---|
| 4,748,490 | 5/1988 | Hollingsworth | 357/51 |
| 5,070,384 | 12/1991 | McCollum et al. | 357/51 |
| 5,100,827 | 3/1992 | Lytle | 437/52 |
| 5,272,101 | 12/1993 | Forouhi | 257/530 |
| 5,373,169 | 12/1994 | McCollum | 257/530 |
| 5,411,917 | 5/1995 | Forouhi | 257/530 |
| 5,502,315 | 3/1996 | Chua et al. | 257/530 |

FOREIGN PATENT DOCUMENTS

93/07675  8/1993  WIPO .................... 23/525

*Primary Examiner*—Mahshid D. Saadat
*Assistant Examiner*—Valencia Martin Wallace
*Attorney, Agent, or Firm*—Townsend and Townsend and Crew LLP

[57] ABSTRACT

The present invention provides for an antifuse in an integrated circuit, which has a stacked antifuse structure on a first interconnection line. The stacked structure has a first programming layer of amorphous silicon on the first interconnection line, a very thin insulating layer of silicon dioxide on the first programming layer, and a second programming layer of amorphous silicon on the very thin oxide layer. A second interconnection line on the second programming layer completes the antifuse which has a low leakage current between the first and second interconnection lines.

20 Claims, 3 Drawing Sheets

5,682,058

MULTILAYER ANTIFUSE WITH LOW LEAKAGE AND METHOD OF MANUFACTURE THEREFOR

BACKGROUND OF THE INVENTION

The present invention is related to integrated circuit structure and processing technology and, more particularly, to antifuses in integrated circuits and their manufacture.

Antifuses are found in a growing number of integrated circuits, most of which are field programmable gate arrays (FPGA's). As the name implies, antifuses have a very high resistance (to form essentially an open circuit) in the unprogrammed ("off") state, and a very low resistance (to form essentially a closed circuit) in the programmed ("on") state. In these integrated circuits antifuses are placed at the intersections of interconnection lines which lead to different elements of the integrated circuit. By programming selected antifuses, the interconnections between the various elements of the integrated circuit are formed to define the function of the device.

In a typical antifuse structure a programming layer of antifuse material, such as amorphous silicon, is sandwiched between two metal interconnection lines. Depending upon the material of each metal interconnection layer, a layer of barrier metal, such as TiW (titanium-tungsten), is placed between the programming layer and each metal interconnection layer. Barrier metal layers function to block the undesired interdiffusion of material from the programming layer, silicon from amorphous silicon, and material from a metal layer, aluminum from aluminum alloy, for instance. Barrier metal layers are typically refractory metals, their intermetallics, alloys, silicides, nitrides and combinations thereof.

However, various problems have been found with present antifuses. One problem is leakage of current through the unprogrammed antifuse. It has been found that while current leakage is minimal for an individual antifuse, 3–10 nA typically, the cumulative effect in an FPGA having hundreds of thousands of antifuses is considerable. Therefore it is desirable to have antifuses with low leakage currents.

The present invention solves or substantially mitigates these problems.

SUMMARY OF THE INVENTION

The present invention provides for an antifuse in an integrated circuit, which has a stacked antifuse structure on a first interconnection line. The stacked structure has a first programming layer of amorphous silicon on the first interconnection line, a very thin insulating layer of silicon dioxide on the first programming layer, and a second programming layer of amorphous silicon on the very thin oxide layer. A second interconnection line on the second programming layer completes the antifuse which has a low leakage current between the first and second interconnection lines.

The present invention also provides for a method of forming an antifuse in an integrated circuit having a first insulating layer on a semiconductor substrate. The method comprises forming a first metal interconnection layer on the insulating layer; forming a first programming layer of amorphous silicon on said first metal interconnection layers forming a very thin insulating layer of silicon dioxide on the first programming layer; forming a second programming layer of amorphous silicon on the very thin oxide layers and forming a second metal interconnection layer on the second programming layer. An antifuse with low leakage between the first and second interconnection layers is formed.

BRIEF DESCRIPTION OF THE DRAWINGS

A more detailed understanding of the present invention may be achieved by perusing the following Detailed Description of Preferred Embodiments of the present invention with reference to the following drawings.

DETAILED DESCRIPTION OF PREFERRED EMBODIMENTS

Figure 1A:
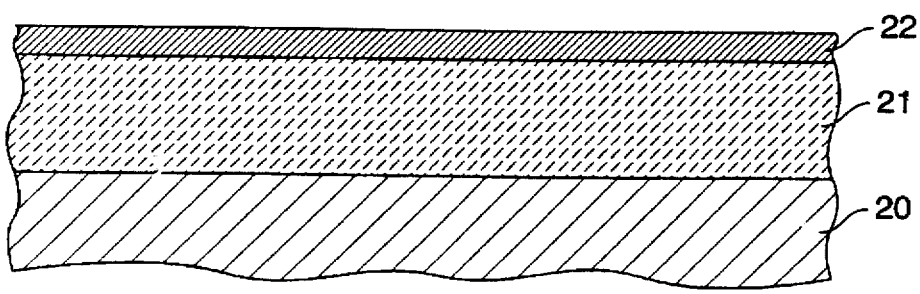
FIGS. 1A–1G illustrate a sequence of steps used to manufacture an antifuse structure according to one embodiment of the present invention.

FIGS. 1A–1G illustrate the steps of manufacturing an antifuse according to one embodiment of the present invention. It should be understood that the insulating layer 20 is formed on top of a semiconductor substrate upon whose surface are formed the various elements of an integrated circuit. These elements, such as transistors, are not shown in the drawings. A first interconnection line is formed on an insulating layer 20 which covers the various integrated circuit elements, such as transistors, in the substrate (not shown). An aluminum alloy layer 21 is deposited, followed by a barrier metal layer 22 of titanium-tungsten (TiW). Both layers are deposited by sputtering the layer 21 to a thickness from 5000 to 7000 Å and the layer 22 from 500 to 2000 Å.

Figure 1B:
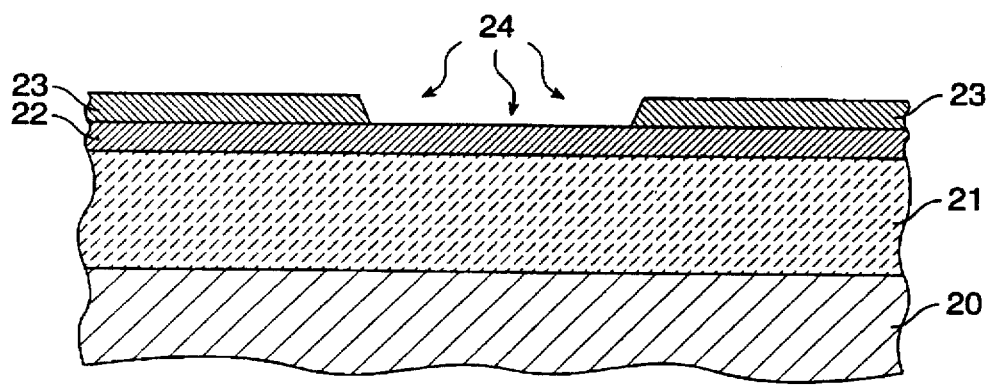

As shown in FIG. 1B, a relatively thin insulating layer 23 is then deposited over the first interconnection line, formed by the layers 21 and 22 and the first insulating layer 20. The layer 23 is deposited by chemical vapor deposition to a thickness in the range of 1000 to 2000 Å. The layer 23 is formed from silicon dioxide, such as undoped silicate glass, phosphosilicate glass (PSG), or borophosphosilicate glass (BPSG). With standard photolithographic and etching techniques and an antifuse window via mask, a via 24 is formed in the insulating layer 23 to expose a portion of the top surface of the TiW layer 22 where the antifuse is to be located.

Figure 1C:
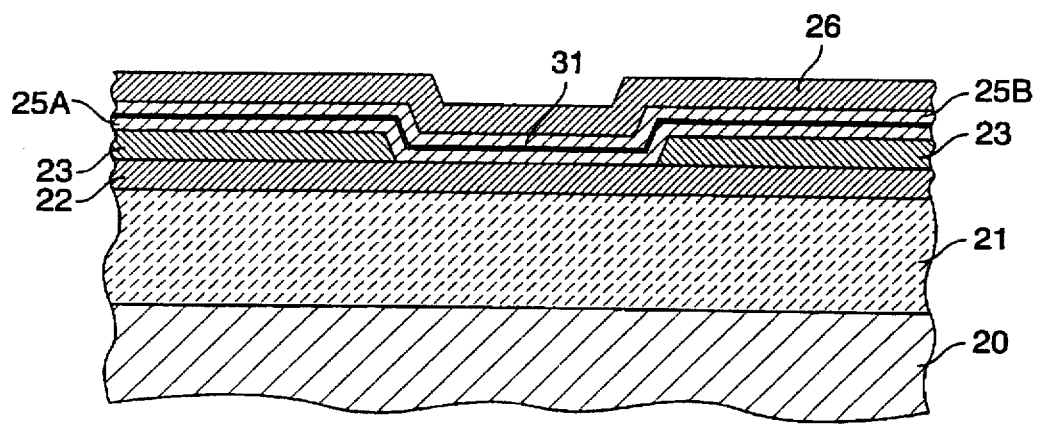

Then a programming layer 25A of antifuse material such as amorphous silicon is deposited by plasma-enhanced chemical vapor deposition. The thickness of the layer is approximately 400 Å. The amorphous silicon contains hydrogen from 10 to 20% by atomic weight. Subsequently, a very thin insulating layer 31 of silicon dioxide is then deposited with a thickness of 20 Å. This is followed by a second programming layer 25B of antifuse material such as amorphous silicon having a thickness of approximately 400 Å. The resulting structure of this step is shown in FIG. 1C.

To protect the programming layers 25A and 25B, and the thin insulating layer 31, a protective capping layer 26 of barrier metal is deposited over the second programming layer 25B. The layer 26 is a barrier metal, such as TiW, of 1000 to 2000 Å thickness. The layer 26 may be dispensed with if the subsequent processing steps do not adversely affect the layers 25A, 25B and 31.

Figure 1D:
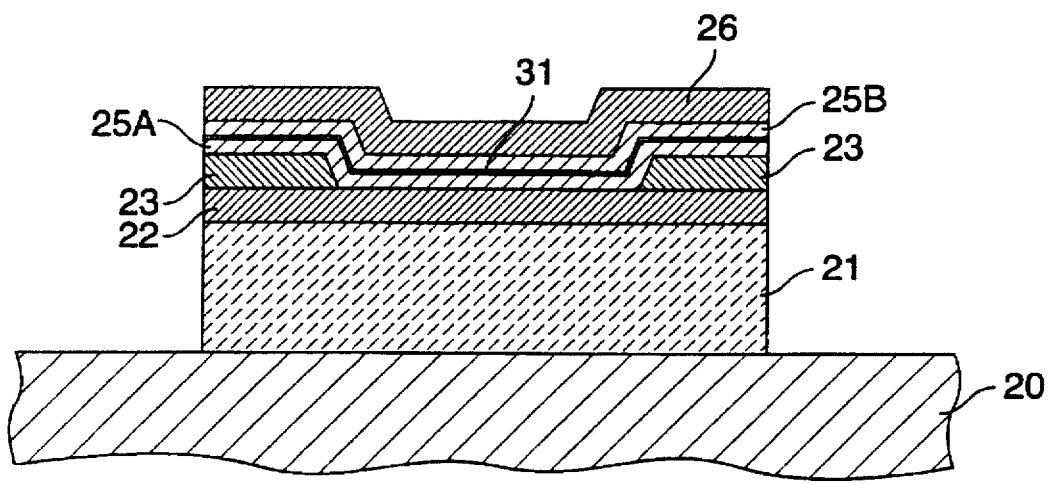

Two masking and etching operations are then performed. First, with an antifuse mask, the layers 25A, 25B, 31, and 26 are defined. The object of this definition of the layers 25A, 25B, 31 and 26 is to limit these layers in the direction along which the first interconnection line, formed by the layers 21 and 22, is to be defined. As shown, this direction is perpendicular to the plane of the drawings. With a first interconnection line mask, the layers 21, 22, 23, 25A, 25B, 31 and 26 are masked and etched to define the set of first interconnection lines formed by aluminum alloy layer 21 and barrier metal layer 22. As shown in FIG. 1D, this operation also defines the layers 23, 25A, 25B, 31 and 26 in the direction perpendicular to the direction of the first interconnection line on which the antifuse is placed. The layers 23, 25A, 25B, 31 and 26 are self-aligned with the sides of the layers 21 and 22.

Figure 1E:
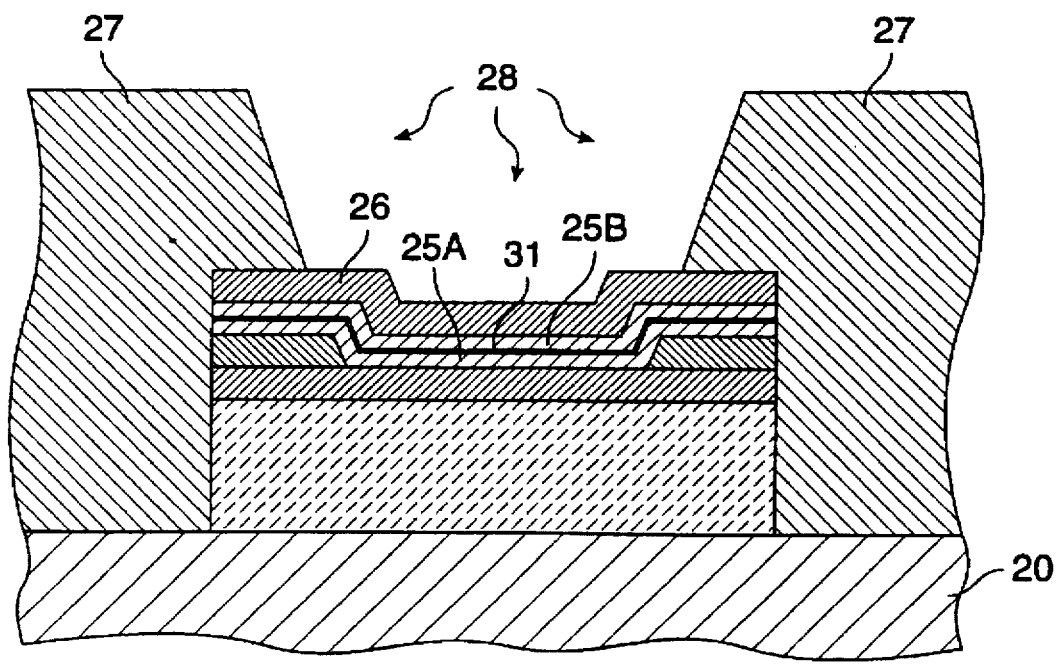

A thick insulating layer 27 of silicon dioxide is deposited to blanket the layers 21–26. From the top surface of the first insulating layer 20 the layer 27, which may be formed from undoped silicate glass, BPSG, or PSG, has a thickness in the range from 5000 to 12000 Å. As shown in FIG. 1E, with an antifuse via mask a via 28 is defined and formed through the layer 27 to expose a top surface of the layer 26.

Figure 1F:
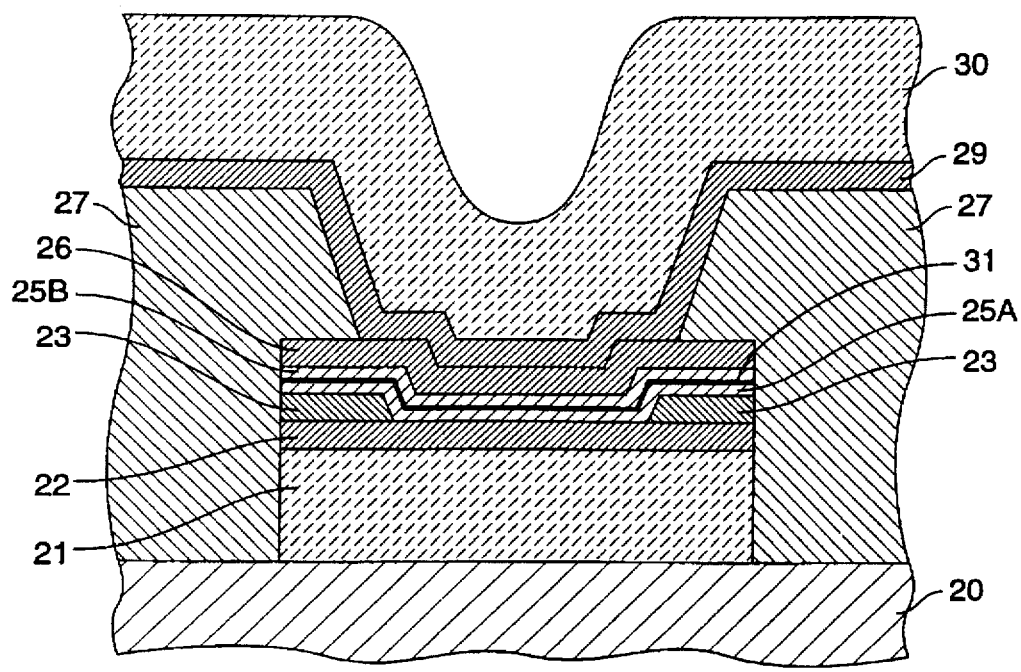

By sputtering, a barrier metal layer 29 of titanium-tungsten is deposited to a thickness of 1,000 to 2,000 Å. Generally, enough barrier metal should be deposited to provide a sufficient amount of metal in forming the programmed antifuse. This is followed by a layer 30 of aluminum alloy, as shown in FIG. 1F, sputtered to a thickness of 5,000 to 9,000 Å.

With a second interconnection line mask, the layers 29 and 30 are masked and etched by standard photolithographic and etching techniques. The second set of interconnection lines are formed from the TiW layer 29 and the aluminum alloy layer 30.

Figure 1G:
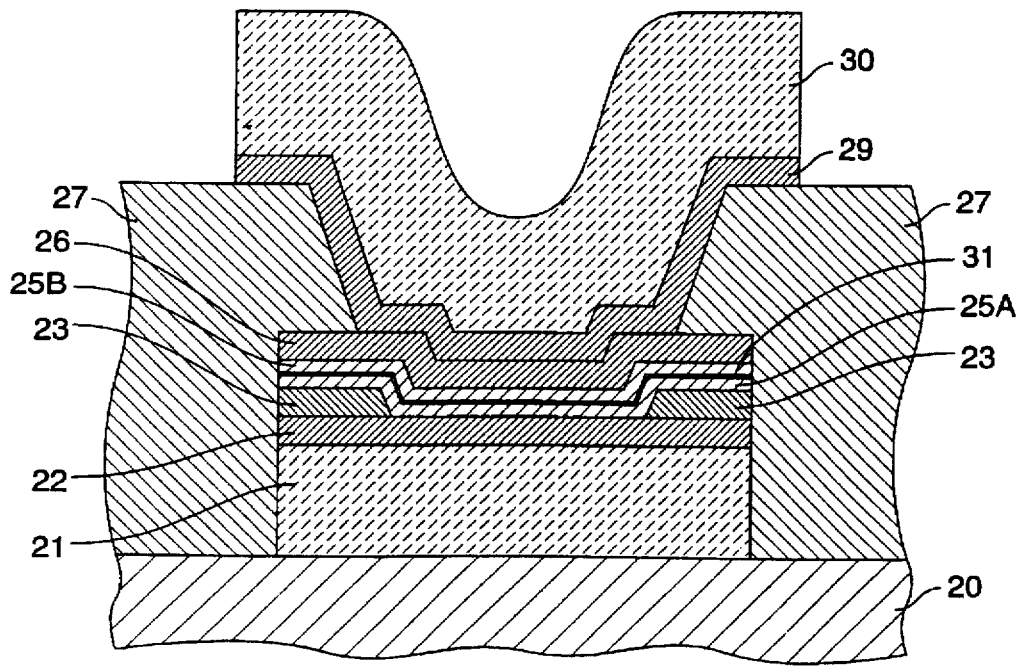

The completed antifuse structure is shown in FIG. 1G. Not shown are the layers, such as the passivating layers, which are deposited subsequently to complete the integrated circuit. The thin oxide layer 31 between the amorphous silicon layers 25A and 25B effectively blocks leakage currents between the interconnection lines without interfering with programmability of the antifuse. Alternatively, the thin oxide layer may be overlying an amorphous silicon layer (or programming layer) without another amorphous silicon layer overlying the thin oxide layer. Such thin oxide layer which does not have an overlying amorphous silicon layer also blocks leakage currents between the interconnection lines.

A further advantage of this antifuse is that the amorphous silicon layers 25A and 25B are nearly flat. This allows a more consistent and uniform deposition of the layer, as compared to the deposition in a deep via. This allows programming of the antifuse to be performed more consistently. The via which is formed in the insulating layer 27 to permit the connection of the second interconnection line need not be as deep as found in the prior art. This allows for a better step coverage for the titanium-tungsten layer 29 and aluminum layer 30 which form the second interconnection line.

Furthermore, the antifuse structure has a capacitance limited by the area of the contact between the TiW layer 22 and the amorphous silicon layer 25A. This area is defined by the via 24 through the insulating layer 23 and by the definition of the antifuse window mask. With such feature, the capacitance of the antifuse may be controlled.

To further lower $R_{ON}$, the resistance of the programmed antifuse, the upper programming layer 25B may be doped with impurities. The lower programming layer 25A remains undoped. The location of the doped programming layer is dependent upon the location of the polarities of the programming voltages for the antifuse. It is with the assumption that the first interconnection line is positive with respect to the second, upper, interconnection line during programming, that upper programming layer is doped with n-type dopants.

The antifuse structure is, for example, illustrated with an amorphous silicon/silicon dioxide/amorphous layer. Such structure may also include other multilayer antifuse structures such as amorphous silicon/silicon dioxide, silicon dioxide/silicon nitride, silicon nitride/silicon dioxide/silicon nitride, silicon dioxide/silicon nitride/silicon dioxide, among other suitable combinations. The thickness and composition of each layer is typically adjusted to produce the desired programming voltage and reduced current leakage.

While the above is a complete description of the preferred embodiments of the invention, various alternatives, modifications and equivalents may be used. It should be evident that the present invention is equally applicable by making appropriate modifications to the embodiments described above.

What is claimed is:

1. An antifuse structure in an integrated circuit comprising:

a first interconnection line;

a first insulating layer on said first interconnection line, said first insulating layer having a first aperture exposing a portion of said first interconnection line;

a first programming layer over said first insulating layer and in said first aperture to contact said portion of said first interconnection line;

a second insulating layer over said first programming layer;

a second programming layer over said second insulating layer;

a third insulating layer over said second programming layer, said third insulating layer having a second aperture exposing a portion of said second programming layer, said second aperture wider than said first aperture; and a second interconnection line over said third insulating layer and in said second aperture to contact said portion of said second programming layer;

whereby said antifuse structure has low leakage current between said first interconnection line and said second interconnection line.

2. The antifuse structure of claim 1 wherein said second insulating layer comprises silicon dioxide and is approximately 20 Å thick.

3. The antifuse structure of claim 1 wherein said first programming layer and said second programming layer comprise amorphous silicon.

4. The antifuse structure of claim 3 wherein said first programming layer and said second programming layer are each approximately 400 Å thick.

5. The antifuse structure of claim 3 wherein said first programming layer and said second programming layer have 10 to 20% hydrogen by composition.

6. The antifuse structure of claim 3 wherein one of said first programming layer and said second programming layer comprises semiconductor dopants.

7. The antifuse structure of claim 3 wherein said first interconnection line and said second interconnection line comprise aluminum, and said antifuse structure further including a barrier metal layer disposed between said first interconnection line and said first programming layer, and a barrier metal layer disposed between said second interconnection line and said second programming layer.

8. An antifuse structure in an integrated circuit comprising:

a first interconnection line;

an insulating layer on said first interconnection line, said insulating layer having a first aperture exposing a portion of a top surface of said first interconnection line;

a first programming layer over said insulating layer and in said first aperture to contact said portion of said first interconnection line top surface;

a relatively thin insulating layer on said first programming layer;

a second programming layer on said relatively thin insulating layer;

a relatively thick insulating layer over said second programming layer having a second aperture exposing a portion of a top surface of said second programming layer; and a second interconnection line over said relatively thick insulating layer and in said second aperture contacting said portion of said second programming layer;

whereby said antifuse structure has low leakage current between said first interconnection line and said second interconnection line.

9. The antifuse structure of claim 8 wherein said relatively thin insulating layer is approximately 20 Å thick.

10. The antifuse structure of claim 8 wherein said relatively thick insulating layer is from 5,000 to 12,000 Å thick.

11. The antifuse structure of claim 8 wherein said first programming layer and said second programming layer comprise amorphous silicon.

12. The antifuse structure of claim 11 wherein said first programming layer and said second programming layer are each approximately 400 Å thick and have 10 to 20% hydrogen by composition.

13. The antifuse structure of claim 11 wherein one of said first programming layer and said second programming layer comprises semiconductor dopants.

14. The antifuse structure of claim 8 wherein said first interconnection line and said second interconnection line comprise aluminum, and said antifuse structure further including a barrier metal layer disposed between said first interconnection line and said first programming layer, and a barrier metal layer disposed between said second interconnection line and said second programming layer.

15. An antifuse structure in an integrated circuit comprising:

a first interconnection line;

a first insulating layer on said first interconnection line, said first insulating layer having a first tapered aperture exposing a portion of said first interconnection line;

a first programming layer over said first insulating layer and in said first tapered aperture to contact said portion of said first interconnection line;

a second insulating layer over said first programming layer;

a second programming layer over said second insulating layer;

a third insulating layer over said second programming layer, said third insulating layer having a second tapered aperture exposing a portion of said second programming layer; and a second interconnection line over said third insulating layer and in said second tapered aperture to contact said portion of said second programming layer;

whereby said antifuse structure has low leakage current between said first interconnection line and said second interconnection line.

16. The antifuse structure of claim 15 wherein said first programming layer and said second programming layer comprise amorphous silicon.

17. The antifuse structure of claim 16 wherein said first programming layer and said second programming layer are each approximately 400 Å thick.

18. The antifuse structure of claim 16 wherein said first programming layer and said second programming layer have 10 to 20% hydrogen by composition.

19. The antifuse structure of claim 16 wherein one of said first programming layer and said second programming layer comprises semiconductor dopants.

20. The antifuse structure of claim 16 wherein said first interconnection line and said second interconnection line comprise aluminum, and said antifuse structure further including a barrier metal layer disposed between said first interconnection line and said first programming layer, and a barrier metal layer disposed between said second interconnection line and said second programming layer.

* * * * *